US 008527254B2

(12) United States Patent
Igarashi

(10) Patent No.: US 8,527,254 B2
(45) Date of Patent: Sep. 3, 2013

(54) SIMULATOR ENGINE DEVELOPMENT SYSTEM AND SIMULATOR ENGINE DEVELOPMENT METHOD

(75) Inventor: Jun Igarashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 812 days.

(21) Appl. No.: 12/068,122

(22) Filed: Feb. 1, 2008

(65) Prior Publication Data

US 2008/0208554 A1 Aug. 28, 2008

(30) Foreign Application Priority Data

Feb. 22, 2007 (JP) ................................. 2007-042494

(51) Int. Cl.
*G06F 17/50* (2006.01)
(52) U.S. Cl.
USPC .......................................................... 703/13
(58) Field of Classification Search
USPC .......................................................... 703/13
See application file for complete search history.

(56) References Cited

U.S. PATENT DOCUMENTS

| | | | | |
|---|---|---|---|---|
| 5,872,977 | A * | 2/1999 | Thompson ..................... | 717/122 |
| 6,075,537 | A | 6/2000 | Adapathya et al. | |
| 7,155,690 | B2 | 12/2006 | Yamashita et al. | |
| 7,373,638 | B1 * | 5/2008 | Schliebusch et al. ......... | 717/136 |
| 2003/0208723 | A1 * | 11/2003 | Killian et al. .................... | 716/1 |
| 2004/0250231 | A1 * | 12/2004 | Killian et al. .................... | 716/18 |
| 2006/0059464 | A1 * | 3/2006 | Jameson ......................... | 717/120 |
| 2006/0259516 | A1 * | 11/2006 | Stakutis et al. ............... | 707/200 |

FOREIGN PATENT DOCUMENTS

| | | |
|---|---|---|
| JP | 4-115330 | 4/1992 |
| JP | 11-232004 | 8/1999 |
| JP | 2002-354039 | 12/2002 |
| JP | 2004-234528 A | 8/2004 |

OTHER PUBLICATIONS

John Savill, "How can I append the date and time to a file?", Aug. 2000, www.windowsitpro.com/article/server-management/how-can-i-append-the-date-and-time-to-a-file-.aspx, pp. 1-5.*
Kathy Dang Nguyen et al., "Model-driven SoC Design via executable UML to SystemC", 2004, Proceedings of the 25th IEEE International Real-Time Systems Symposium, ten unnumbered pages.*
Rodolfo Azevedo et al., "The ArchC architecture description language and tools", Oct. 2005, International Journal of Parallel Programming, vol. 33, No. 5, pp. 453-484.*

(Continued)

*Primary Examiner* — Dwin M Craig
*Assistant Examiner* — Russ Guill
(74) *Attorney, Agent, or Firm* — Fujitsu Patent Center

(57) ABSTRACT

A simulator development system is disclosed, including a data file management part to create a data file storing data concerning a plurality of types of integrated circuits, for each update and to manage the data file with a file name including a date and time when the data file is updated; and a simulator generation part to specify a latest data file from a plurality of the data files retrieved based on a type name, by referring to the date and time included in the file name in response to a selection of the type name of the integrated circuit, and to generate the simulator corresponding to the type of the integrated circuit, which type is specified by a type name.

7 Claims, 11 Drawing Sheets

(56) References Cited

OTHER PUBLICATIONS

P. Mishra et al., "Architecture description languages for programmable embedded systems", May 2005, IEE Proceedings—Computers and Digital Techniques, vol. 152, No. 3, pp. 285-297.*

Tero Kangas et al., "UML-Based multiprocessor SoC design Framework", May 2006, ACM Transactions on Embedded Computing Systems, vol. 5, No. 2, pp. 281-320.*

David A. Patterson et al., "Computer architecture a quantitative approach," second edition, 1996, Morgan Kaufmann Publishers, pp. 682-684.*

"Japanese Office Action" mailed by JPO and corresponding to Japanese application No. 2007-042494 on Jun. 14, 2011, with partial English translation.

Ishida, Yukari et al., "Development and evaluation of virus check system using FPGA", IEICE Technical Report, Japan, Institute of Electronics, Information and Communication Engineers, vol. 106, No. 394, Nov. 23, 2006, pp. 7-12, (with English Abstract).

Japanese Office Action mailed Nov. 15, 2011 for corresponding Japanese Application No. 2007-042494, with partial English-language translation.

* cited by examiner

FIG.5

11b PARAMETER LIST FILE (CONTENTS) FILE NAME 20060217l121-paramlist.txt
REGISTER NAMES AND INITIAL VALUES OF MACRO [A]
define  Reg1 5       //MODE SWITCH
define  Reg2 33      //FREQUENCY STABILITY WAIT
define  Reg3 128     //
define  Reg4 3       //

REGISTER NAMES AND INITIAL VALUES OF MACRO [B]
define  Reg1b1 5     // MODE SWITCH
define  Reg2b5       // FREQUENCY STABILITY WAIT
define  Reg3b8       //

REGISTER NAMES AND INITIAL VALUES OF MACRO [X]
..

....

10b  I/O RELATED DATA

FIG.6
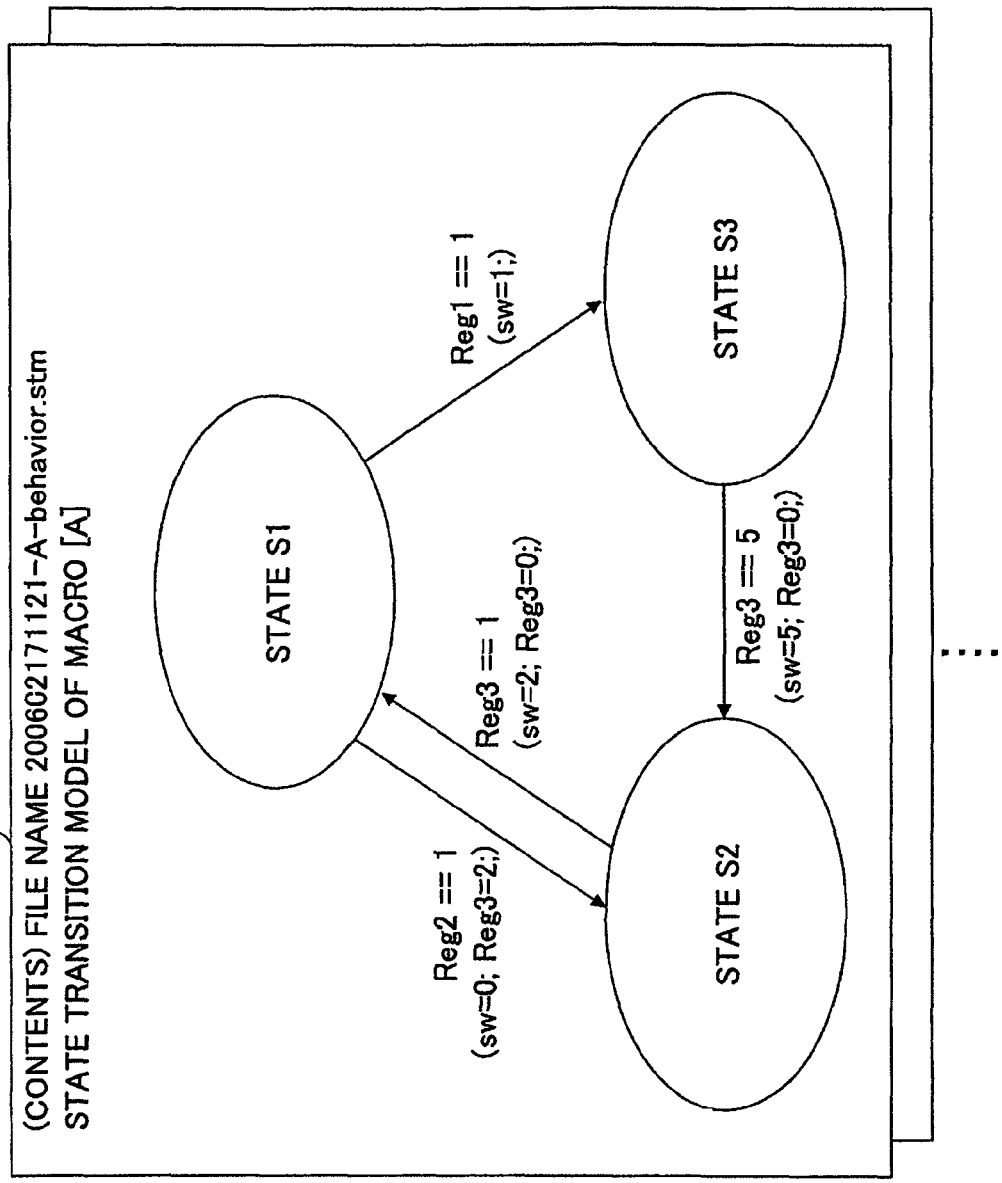
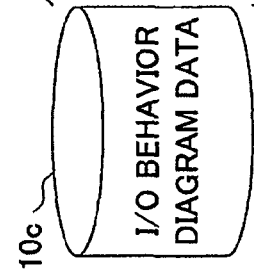

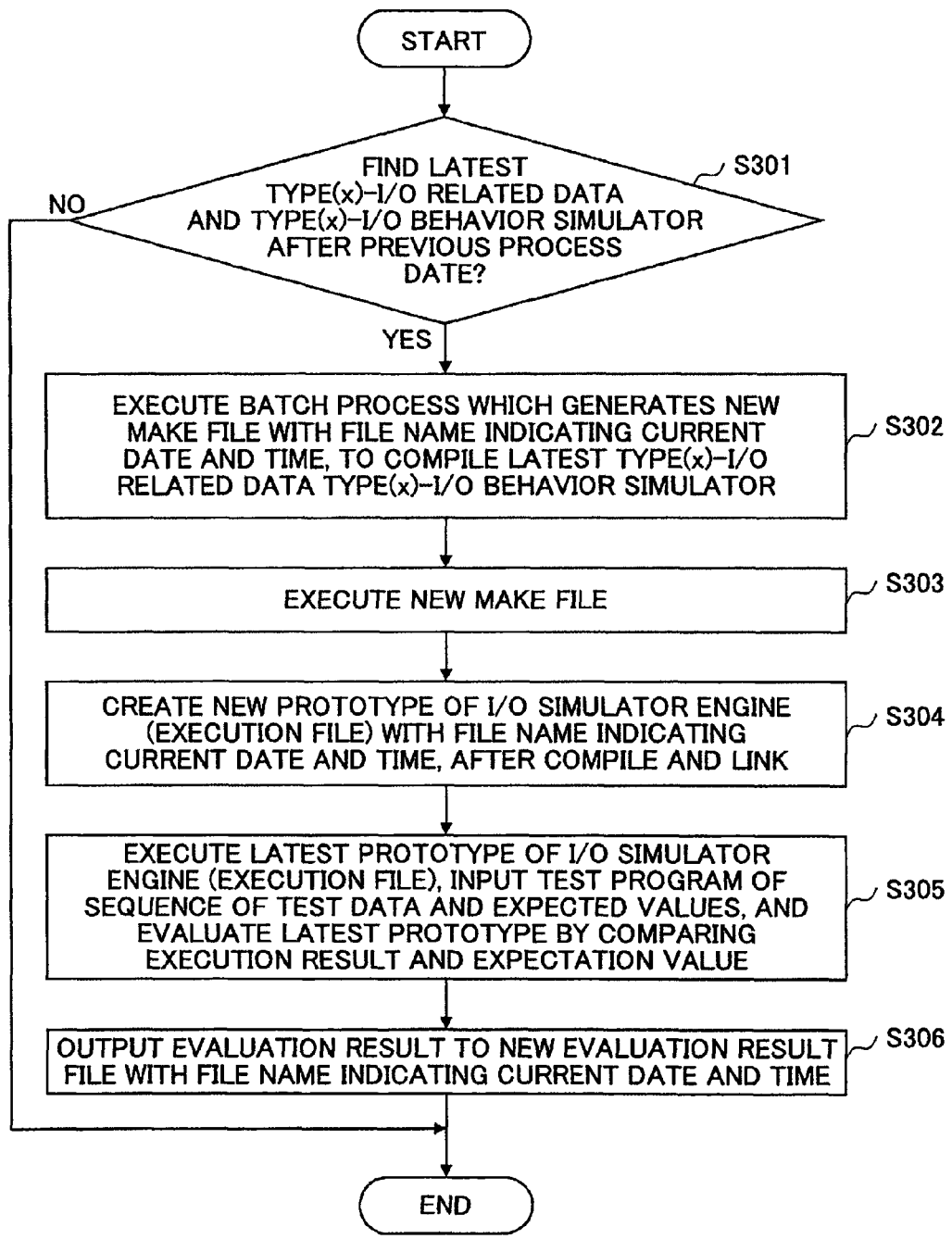

SIMULATOR ENGINE DEVELOPMENT SYSTEM AND SIMULATOR ENGINE DEVELOPMENT METHOD

CROSS-REFERENCE TO RELATED APPLICATION

The present application is based on Japanese Priority Application No. 2007-042494 filed Feb. 22, 2007, the entire contents of which are hereby incorporated by reference.

BACKGROUND OF THE INVENTION

1. Field of the Invention

The present invention generally relates to a simulator development system and a simulator development method which automatically generates a simulator for each of various types of semiconductor circuits.

2. Description of the Related Art

In developing micro processors (MPUs: Micro Processing Units), various types of the micro processors were developed by modifying Input/Output (I/O) parts and combining the I/O parts while maintaining the same control part for controlling the entire process. Each of the micro processors was verified by using an I/O simulator.

On the other hand, it is required to develop the I/O simulator based on a hardware specification of the developed micro processor. The I/O simulator is developed by a software tool developer who has technical knowledge so that I/O parts of the developed type of the micro processor are developed by using an object oriented language.

Japanese Laid-open Patent Application No. 2002-354039 discloses to automatically generate a test bench by making models as objects of the object oriented language based on text data created from a specification in order to reduce workload of a simulator developer.

Conventionally, as shown in FIG. 1, when developing an Large Scale Integration (LSI) 2b, an LSI hardware developer 2 generally creates an LSI specification 2a for a user 4 who uses the developed LSI 2b. The LSI specification 2a may be a manual document.

A software tool developer 3 provides the user 4 an I/O simulator engine 4a for simulating the LSI 2b to allow the user 4 develop a user program 4b using the LSI 2b, before the LSI 2b is completely developed. In order to provide the I/O simulator engine 4a, the software tool developer 3 creates I/O related data 3a which defines parameter data such as initial values of I/O registers, and develops a program of an I/O behavior simulator 3b for simulating a behavior of the developed LSI 2b, based on the LSI specification 2a. Then, the software tool developer 3 creates the I/O simulator engine 4a by using the I/O related data 3a and the I/O behavior simulator 3b, and provides the I/O simulator engine 4a to the user 4.

Instead of waiting until the LSI 2b is completed, the user 4 can develop and verify a user program 4b being original by using the I/O simulator engine 4a provided from the software tool developer 3.

However, even if there is no change for the control part for controlling the entire process of the micro processor, various types of LSIs 2b have been developed by modifying the I/O parts or/and combining some I/O parts. Accordingly, the software tool developer 3 is required to create the I/O related data 3a, the I/O behavior simulator 3b, and the I/O simulator engine 4a, and a workload of the software tool developer 3 has increased.

In addition, since the LSI specification 2a is a document created by the LSI hardware developer 2, there is a problem in that a development of the software tool developer 3 is delayed due to human errors such as missing descriptions and typographical errors in the LSI specification 2a and the I/O simulator engine 4a devoted to the LSI 2b being completed cannot be provided timely to the user 4. Moreover, if the software tool developer 3 begins to develop the I/O behavior simulator 3b and a completion time of the I/O behavior simulator 3a is delayed, the user 4 begins to verify the user program 4b by using the completed LSI 2b without using the I/O simulator engine 4a which is based on the I/O behavior simulator 3b. Thus, there is a problem that the I/O simulator engine 4a is not effectively used by the user program 4b.

SUMMARY OF THE INVENTION

According to one of the aspect of an embodiment, a simulator development system for developing a simulator of an integrated circuit, including: a data file management part configured to create a data file storing data concerning a plurality of types of integrated circuits, for each update and to manage the data file with a file name including a date and time when the data file is updated; and a simulator generation part configured to specify a latest data file from a plurality of the data files retrieved based on a type name, by referring to the date and time included in the file name in response to a selection of the type name of the integrated circuit, and to generate the simulator corresponding to the type of the integrated circuit, which type is specified by a type name.

According to one of the aspect of an embodiment, a simulation development method for a computer to execute the above-described process parts as functions, a program product for causing the computer to conduct the above-described process parts as the functions, and a computer-readable recording medium recorded with a computer program for causing the computer to conduct the above-described process parts as the functions.

BRIEF DESCRIPTION OF THE DRAWINGS

Other objects, features and advantages of the present invention will become more apparent from the following detailed description when read in conjunction with the accompanying drawings, in which:

FIG. 5 is a diagram showing an example of I/O related data;

FIG. 6 is a diagram showing an example of the I/O behavior diagram data;

FIG. 8A is a flowchart for explaining a process conducted by an evaluation program auto-generation part included in an execution program generation part.

DESCRIPTION OF THE PREFERRED EMBODIMENT

An embodiment according to the present invention will be described with reference to the accompanying drawings.

Figure 1:
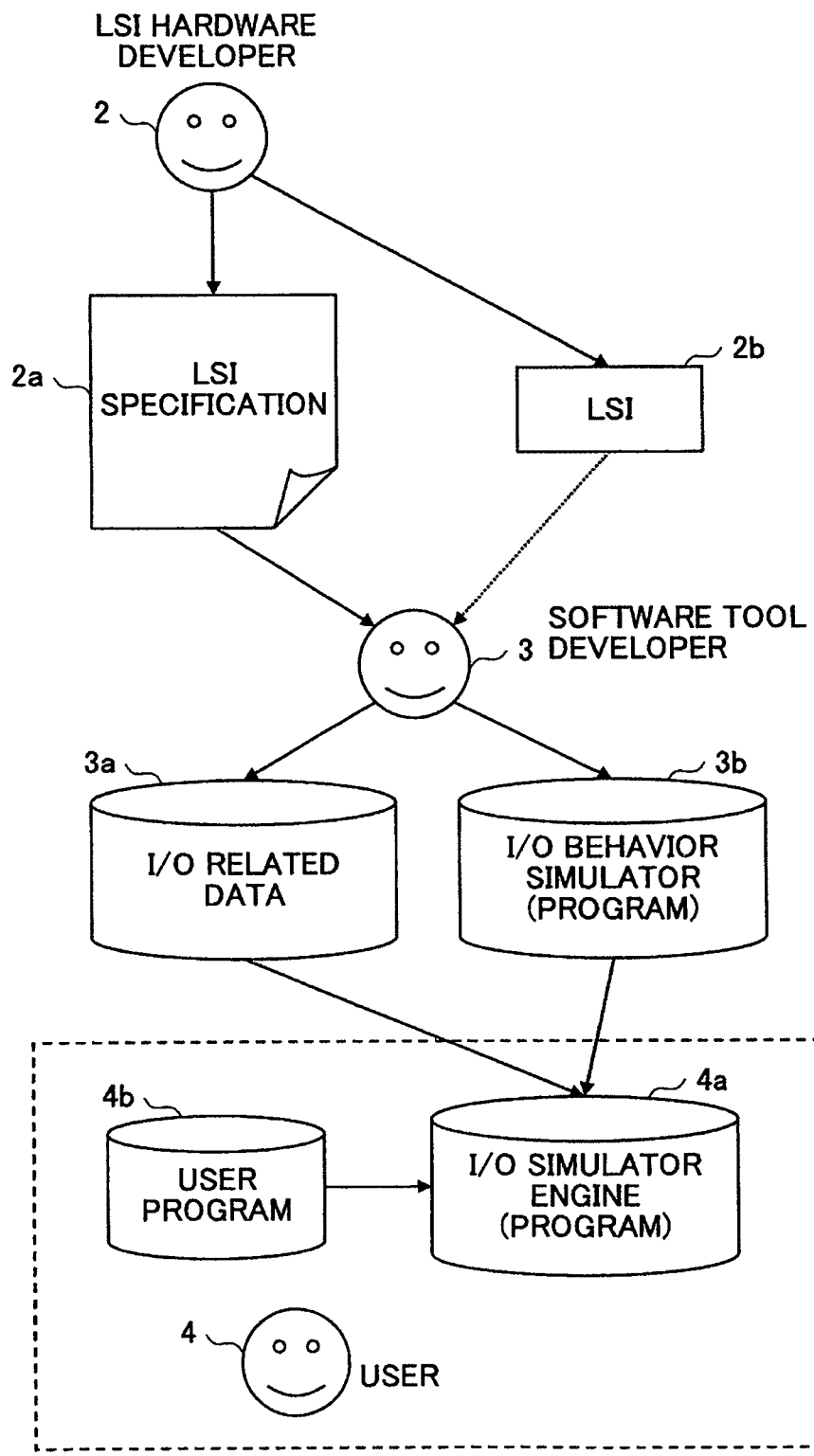
FIG. 1 is a diagram for explaining a conventional simulator development method.
Figure 2:
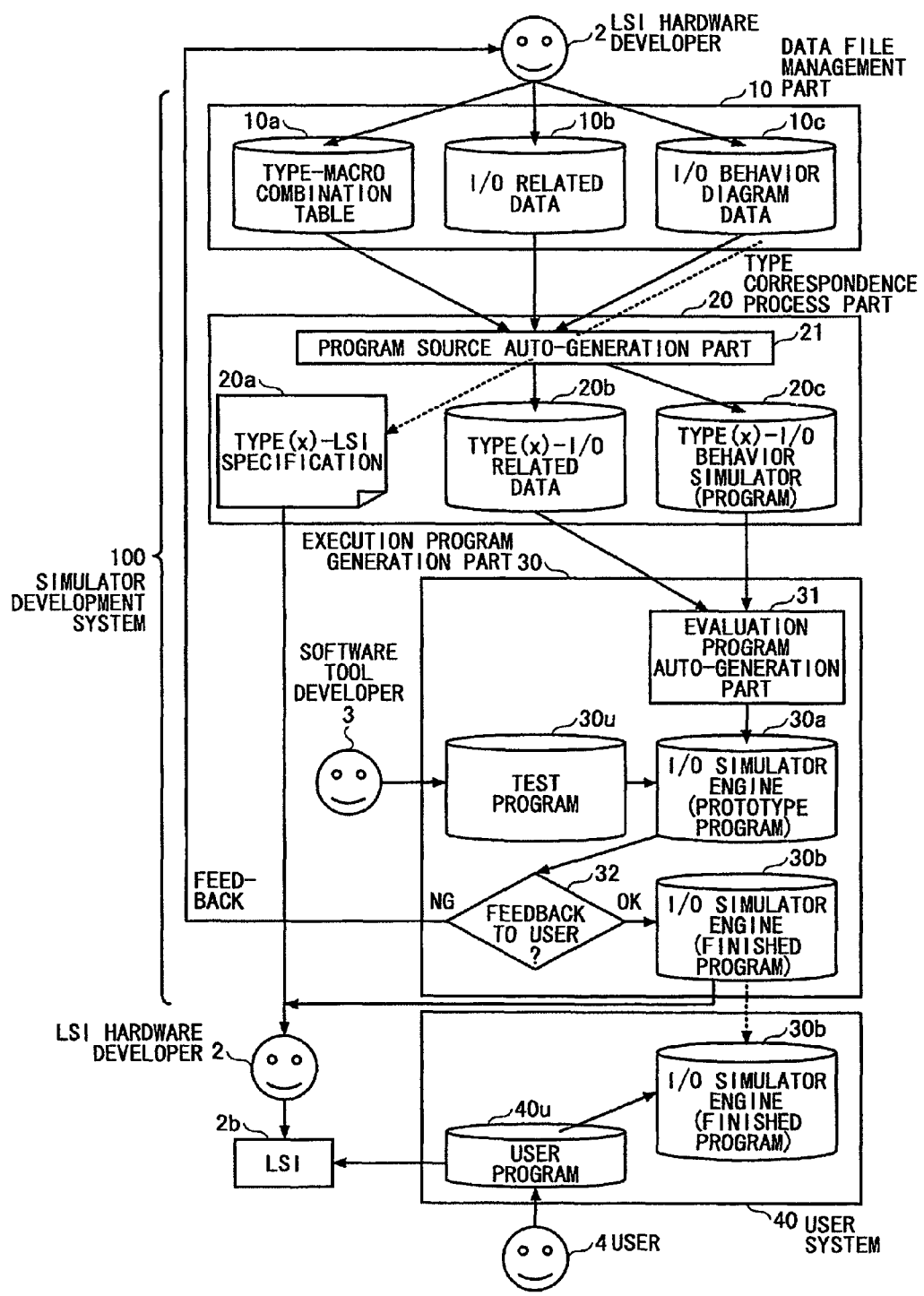
FIG. 2 is a block diagram showing a functional configuration of a simulation development system according to an embodiment of the present invention.

FIG. 2 is a block diagram showing a functional configuration of a simulation development system according to an embodiment of the present invention. In FIG. 2, a simulator development system 100 includes a data file management part 10, a type correspondence process part 20, and an execution program generation part 30.

The simulator development system 100 may be realized by a single computer or two or three computers. For example, in a case of realizing by two computers, the data file management part 10 and the type correspondence process part 20 may be realized by one computer and the execution program generation part 30 may be realized by another computer. Alternatively, the data file management part 10 may be realized by one computer and the type correspondence process part 20 may be realized by another computer. Moreover, the data file management part 10, the type correspondence process part 20, and the execution program generation part 30 may be individually realized by three computers.

The data file management part 10 is a process part which stores and manages various data created by an LSI hardware developer 2 in a predetermined storage area, and includes a type-macro combination table 10a, I/O related data 10b, and I/O behavior diagram data 10c.

The type-macro combination table 10a is a table for defining combinations of internal macros which describes interfaces of I/O parts for each type of an LSI 2b. The I/O related data 10b are stored in a table for defining initial values of parameters such as I/O registers for each internal macro. The I/O behavior diagram data 10c are data for defining a state transition for each macro with an abstract and conceptual diagram. The abstract and conceptual diagram is a diagram rendering relationships between states which change in response to a behavior of each macro. For example, the abstract and conceptual diagram may be an UML (Unified Modeling Language), a class diagram, a sequence diagram, or a like rendered by using CASE (Computer Aided Software Engineering).

The type correspondence process part 20 is a process part that automatically generates data corresponding to a type of the LSI 2b which is selected by an LSI hardware developer 2 or a software tool developer 3 (hereinafter, the selected type is called type(x)), and includes a program source auto-generation part 21. The program source auto-generation part 21 automatically generates a type(x)-LSI specification 20a, a type(x)-I/O related data 20b, and a type(x)-I/O behavior simulator 20c.

The program source auto-generation part 21 reads out the type-macro combination table 10a, the I/O related data 10b, and the I/O behavior diagram data 10c stored in the data file management part 10, and automatically generates the type (x)-LSI specification 20a, the type(x)-I/O related data 20b, and the type(x)-I/O behavior simulator 20c which correspond to a selected type(x).

For example, the program source auto-generation part 21 outputs the type(x)-LSI specification 20a, which explains functions and operations of the type (x) of the LSI 2b, into a file of a document format, outputs the type(x)-I/O related data 20b to a program source of a definition file, and outputs the type(x)-I/O behavior simulator 20c to a program source for simulating a behavior of each of I/O parts of the type(x).

For example, in order to generate a program source from the abstract and conceptual diagram, the program source auto-generation part 21 generates a program source of the type(x)-I/O behavior simulator 20c from the I/O behavior diagram data 10c by using the CASE tool.

The execution program generation part 30 includes an evaluation program auto-generation part 31, an I/O simulator engine 30a of a prototype program, an I/O simulator engine 30b to be a finished program which is provided to a user 4, a test program 30u, and a determination process part 32.

The evaluation program auto-generation part 31 reads the type(x)-I/O related data 20b and the type(x)-I/O behavior simulator 20c which are generated by the type correspondence process part 20, and automatically generates the I/O simulator engine 30a of prototype programs in accordance with a predetermined algorithm. Also, the evaluation program auto-generation part 31 evaluates the I/O simulator engine 30a of the prototype program which is automatically generated, by using the test program 30u which is prepared by the software tool developer 3 beforehand and evaluates whether or not the I/O simulator engine 30a is suitable for a product developed by the user 4. Then, the evaluation program auto-generation part 31 outputs an evaluation result.

The determination process part 32 retrieves a latest evaluation result output from the evaluation program auto-generation part 31. Based on the retrieved latest evaluation result, the determination process part 32 informs contents of feedback used by the LSI hardware developer 2 to the software tool developer 3, or sets the I/O simulator engine 30a of the prototype program as the I/O simulator engine 30b of the finished program.

As described above, the software tool developer 3 simply confirms the latest evaluation result alone if necessary. Accordingly, it is possible to reduce workload of developing the I/O simulator engine 30b which is provided to the user 4, and to provide the user 4 the I/O simulator engine 30b at an earlier stage. In addition, it is possible to provide the LSI hardware developer 2 the I/O simulator engine 30b which is provided to the user 4.

Moreover, since the I/O simulator engine 30a of the prototype program is automatically evaluated, it is possible to effectively feedback the evaluation result to the LSI hardware developer 2.

At a side of a user system 40 which receives the I/O simulator engine 30b from the simulator development system 100, the user 4, who develops a program for a product mounting the LSI 2b, conducts an operation check of a user program 40u developed by using the I/O simulator engine 30b. After completing the operation check, a product in which the LSI 2b and the user program 40u are embedded is produced.

Figure 3:
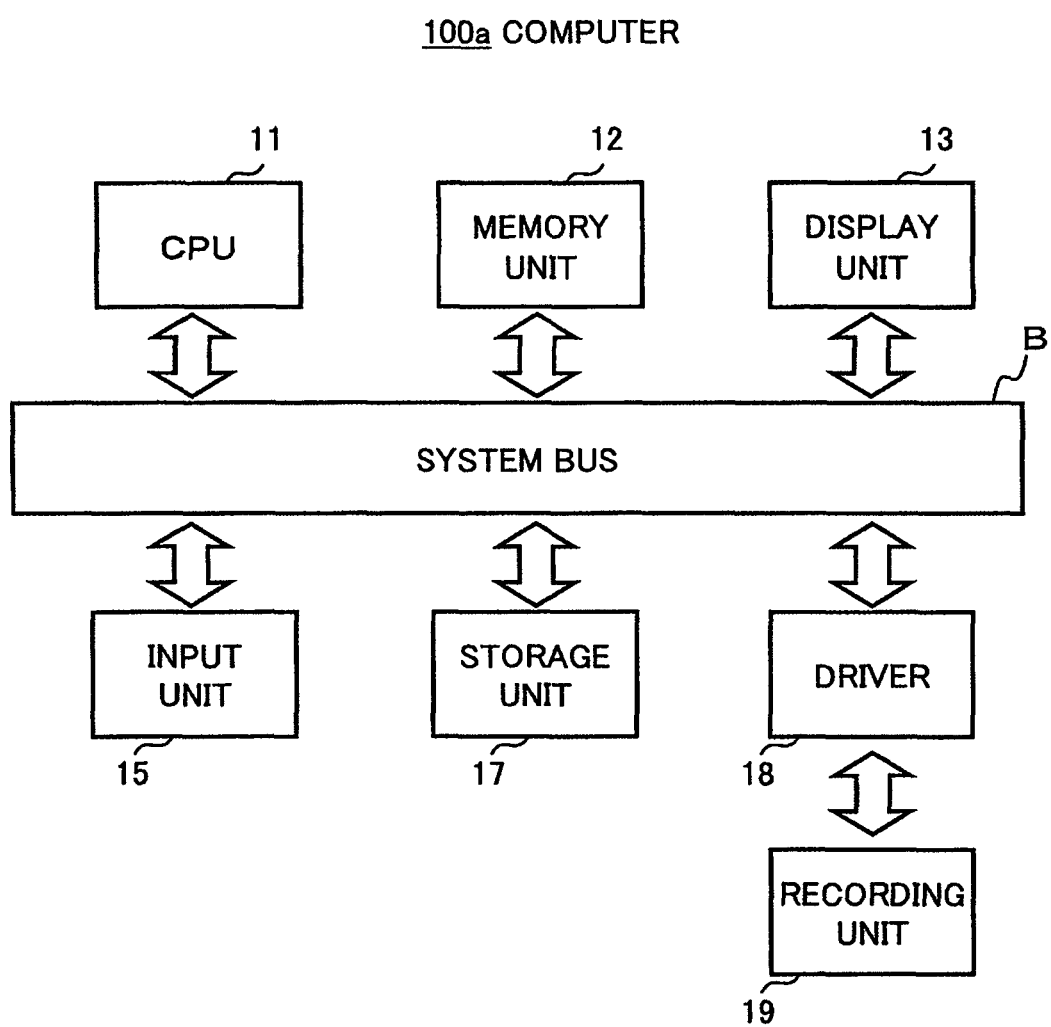
FIG. 3 is a block diagram showing a hardware configuration of a computer realizing the simulator development system according to the embodiment of the present invention.

Each of one to three computers realizing the simulator development system 100 includes a hardware configuration as shown in FIG. 3. FIG. 3 is a block diagram showing a hardware configuration of a computer realizing the simulator development system according to the embodiment of the present invention.

In FIG. 3, a computer 100a realizing the simulator development system 100 includes a CPU (Central Processing Unit) 11, a memory unit 12, a display unit 13, an input unit 15, a storage unit 17, and a driver 18, which are mutually connected to each other by a system bus B.

The CPU 11 controls the computer 100a in accordance with a program stored in the memory unit 12. The memory unit 12 includes a RAM (Random Access Memory), a ROM (Read-Only Memory), and a like to store a program executed by the CPU 11, data necessary for a process conducted by the CPU 11, and data acquired in the process of the CPU 11. Also, a part of a storage area of the memory unit 12 is assigned as a work area used in the process of the CPU 11.

The display unit 13 displays various necessary information under a control of the CPU 11. The input unit 15 includes a mouse, a keyboard, and a like, and is used by a user to input various information required for the computer 100a to process.

For example, the storage unit 17 includes a hard disk unit and stores data such as a program to conduct various processes.

For example, the program realizing the process which is conducted by the computer 100a is provided to the computer 100a by a recording medium 19 such as a CD-ROM (Compact Disk Read-Only Memory) That is, when the recording medium 19 storing the program is set in the driver 18, the driver 18 reads out the program from the recording medium 19, and the program being read out is installed into the storage unit 17 via the system bus B. Then, the CPU 11 executes the program installed in the storage unit 17 and conducts the process in accordance with the program.

It should be noted that the recording medium is not limited to the CD-ROM to store the program and any recording medium which is computer-readable can be used. In a case in that the computer 100a includes a communication unit that conducts communication through a network, the program realizing the process according to the present invention may be downloaded through the network by using the communication unit and be installed into the storage unit 17. In a case in that the computer 100a includes an interface such as a USB (Universal Serial Bus) or a like to connect with an external storage device, the program may be read from the external storage device with a USB connection.

Next, the type-macro combination table 10a, the I/O related data 10b, and the I/O behavior diagram data 10c which are created by the LSI hardware developer 2 will be described with reference to FIG. 4, FIG. 5, and FIG. 6.

Figure 4:
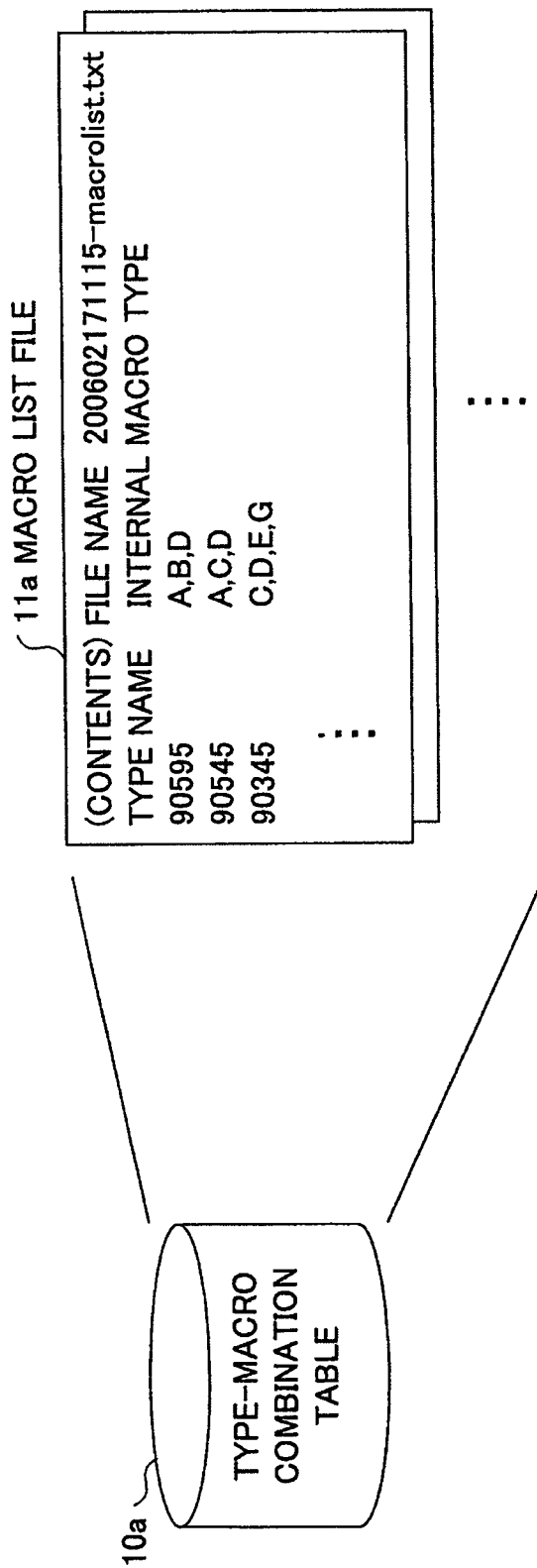
FIG. 4 is a diagram showing an example of a type-macro combination table according to the embodiment of the present invention.

FIG. 4 is a diagram showing an example of the type-macro combination table according to the embodiment of the present invention. The type-macro combination table 10a shown in FIG. 4 stores a macro list file 11a recording a combination of the internal macros which is to be embedded in the LSI 2b, for each type name specifying a type of LSI 2b. A new macro list file 11a is generated for each update of adding and deleting the type names and changing the combination of the internal macros, and is accumulated in the type-macro combination table 10a.

A combination of a date and time when the macro list file 11a is generated, and a name specifying the macro list file 11a is set as a file name of the macro list file 11a. For example, "200602171115-macrolist.txt" is set as the file name.

The macro list file 11a includes items of a type name, an internal macro type, and a like. For example, referring to the macro file 11a of a file name "200602171115-macrolist.txt", internal macros "A", "B", and "ID" are combined for the LSI 2b of a type "90595", internal macros "A", "C", and "D" are combined for the LSI 2b of a type "90545", and internal macros "C", "D", "E", and "G" are combined for the LSI 2b of a type "90345".

FIG. 5 is a diagram showing an example of the I/O related data. The I/O related data 10b shown in FIG. 5 stores a parameter list file 11b recording register names specifying registers and initial values to set to the registers for each internal macro. The parameter list file 11b is generated for each update of adding and deleting the internal macro, adding and deleting the register, and changing the initial value, and is accumulated in the I/O related data 10b.

A combination of a date and time when the parameter list file 11b is generated, and a name specifying the parameter list file 11b as a file name of the parameter list file 11b. For example, "200602171121-paramlist.txt" is set as the file name.

The parameter list file 11b is a file which describes a template defining the initial values corresponding to the register names for each internal macro. For example, in the parameter list file 11b of a file name "200602171121-paramlist.txt", regarding the registers and the initial values for the internal macro "A", an initial value "5" is defined for a register "Reg1", an initial value "23" is defined for a register "Reg2", an initial value "128" is defined for a register "Reg3", and an initial value "3" is defined for a register "Reg4".

FIG. 6 is a diagram showing an example of the I/O behavior diagram data. The I/O behavior diagram data 10c shown in FIG. 6 stores the state transition model file 11c that records diagram data of a state transition model representing a behavior of one internal macro. A new state transition model file 11c is generated for each update of changing the state transition and is accumulated in the I/O behavior diagram data 10c.

A combination of a date and time when the state transition model file 11c, a macro name specifying the internal macro, and a name specifying the state transition model file 11c is set as a file name of the state transition model file 11c. For example, "200602171121-A-behavior.stm" is set as the file name.

The state transition model file 11c is a file in which a template of one internal macro is drawn by using a tool for creating the state transition model. For example, referring to the state transition model file 11c of a file name "200602171121-A-behavior.stm", a state S1, a state S2, and a state S3 is defined for the internal macro "A".

Figure 7:
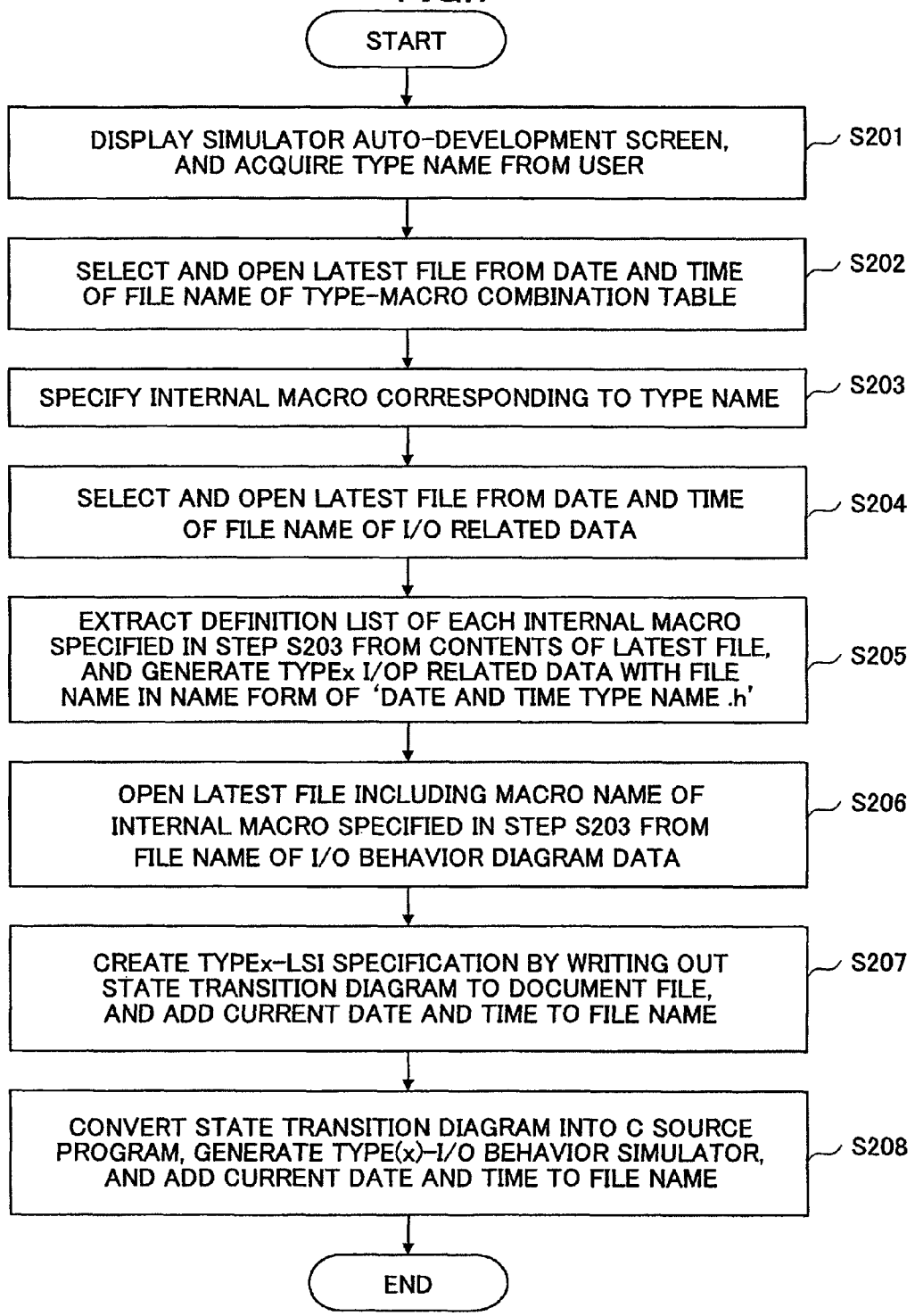
FIG. 7 is a flowchart for explaining a process conducted by a program source auto-generation part.

A process conducted by the program source auto-generation part 21 using the type-macro combination table 10a, the I/O related data 10b, and the I/O behavior diagram data 10c will be described with reference to FIG. 7. FIG. 7 is a flowchart for explaining the process conducted by the program source auto-generation part.

Figure 9A:
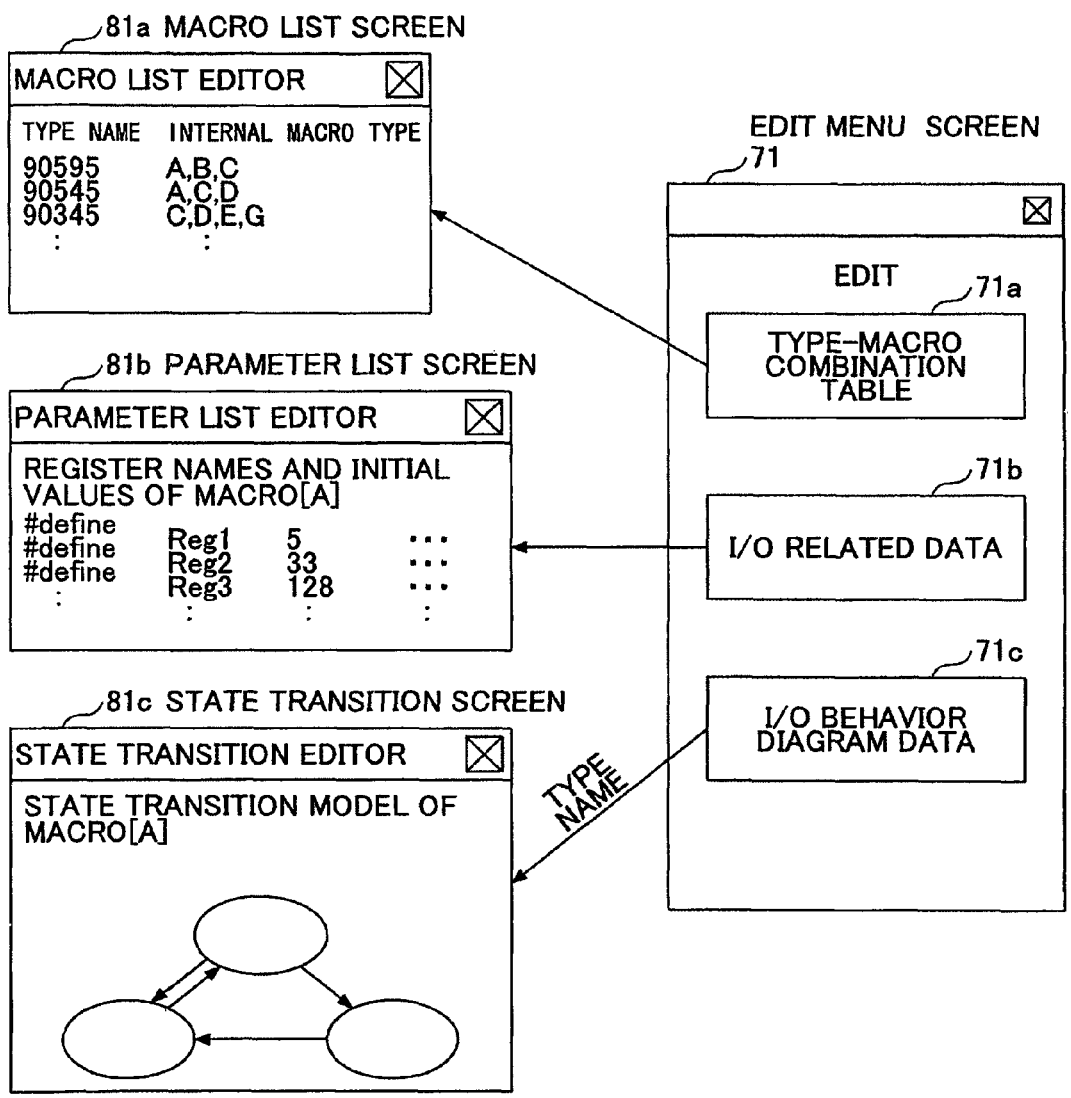
FIG. 9A is a diagram showing an example of an edit menu screen for an LSI hardware developer.
Figure 9B:
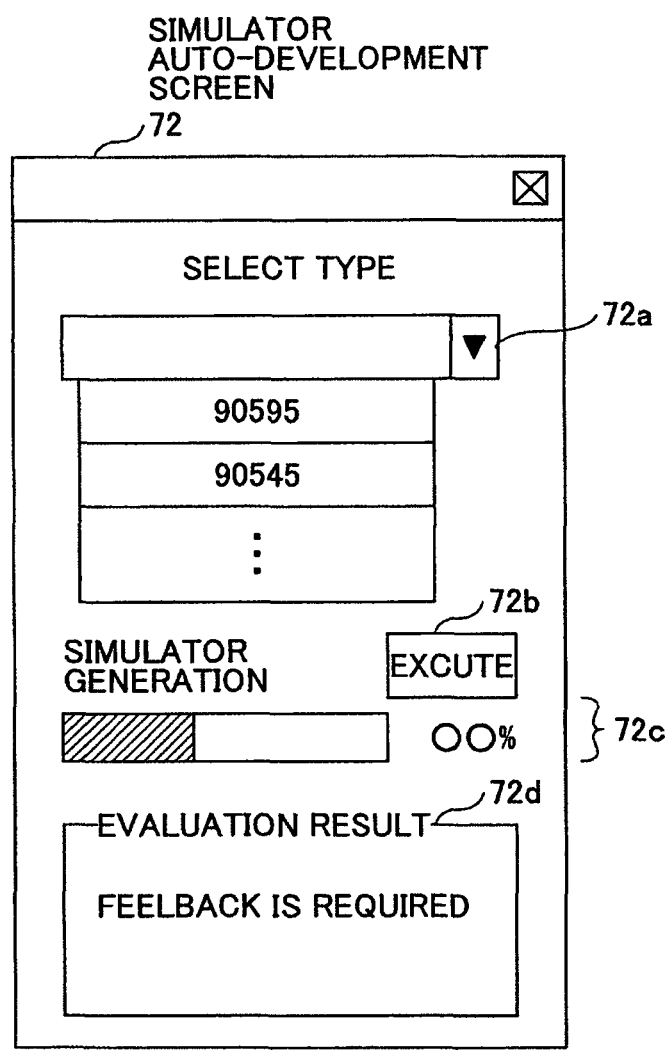
FIG. 9B is a diagram showing an example of a simulator auto-development screen for a software tool developer.

Referring to FIG. 7, the program source auto-generation part 21 acquires a type name of the LSI 2b selected by a user from a simulator auto-development screen 72 as shown in FIG. 9B (step S201).

The program source auto-generation part 21 selects and opens a latest macro list file 11a from one or more macro list files 11a accumulated in the type-macro combination table 10a, based on the date and time included in the file name (step S202). The program source auto-generation part 21 specifies the internal macro corresponding to the type name acquired in the step S201 from the latest macro list file 11a. For example, if the type name is "90595", the internal macros "A", "B", and "D" are specified.

Subsequently, the program source auto-generation part 21 selects and opens a latest parameter list file 11b from one or more parameter list files 11b accumulated in the I/O related data 10b, based on the date and time included in the file name (step S204).

The program source auto-generation part 21 extracts a definition list of each internal macro specified in the step S203 from contents of the latest parameter list file 11b, and generates the type(x)-I/O related data 20b that has a file name in a file name format including a current date and time and the type name (for example, format of a text sequence of a date and time, a type name, and a suffix ".h"). The type(x)-I/O related data 20b generated in the step S205 is accumulated in a storage area.

Also, the program source auto-generation part 21 selects and opens the latest state transition model file 11c for each internal macro from one or more state transition model files 11c accumulated in the I/O behavior diagram data 10c and specified in the step S203, based on the date and time of the file name (step S206).

The program source auto-generation part 21 creates the type(x)-LSI specification 20a by writing out the state transition diagram included in the latest state transition model file 11c for each internal macro to the latest state transition model file 11c, and adds the current date and time to the file name (step S207). The type(x)-LSI specification 20a created in the step S207 is accumulated in the storage area.

Moreover, the program source auto-generation part 21 generates the type(x)-I/O behavior simulator 20c by converting the state transition diagram into a C source program (step S208). The type(x)-I/O behavior simulator 20c generated in the step S208 is accumulated in the storage area.

A process conducted by the execution program generation part 30 using the type(x)-I/O related data 20b and the type (x)-I/O behavior simulator 20c, which are generated by the program source auto-generation part 21, will be described with reference to FIG. 8A and FIG. 8B.

FIG. 8A is a flowchart for explaining the process conducted by the evaluation program auto-generation part included in the execution program generation part. In FIG. 8A, the evaluation program auto-generation part 31 determines whether or not the type(x)-I/O related data 20b and the type (x)-I/O behavior simulator 20c which are the latest from the date and time of a previous process (step S301). When the type(x)-I/O related data 20b and the type(x)-I/O behavior simulator 20c are not found, the process of the evaluation program auto-generation part 31 is terminated.

When the latest type (x)-I/O related data 20b and the latest type(x)-I/O behavior simulator 20c are found in the step S301, the evaluation program auto-generation part 31 conducts a batch process for creating a new makefile with a file name including a current date and time, in order to compile the latest type (x)-I/O related data 20b and the latest type (x)-I/O behavior simulator 20c which file names include a type(x) and a latest date and time (step S302).

Then, the evaluation program auto-generation part 31 executes the new makefile created in the step S302 (step S303). After compiling and linking, the evaluation program auto-generation part 31 creates the I/O simulator engine 30a of a new prototype program as an execution file for the type(x) with the file name including the current date and time (step S304).

The evaluation program auto-generation part 31 executes the I/O simulator engine 30a of a newest prototype program. The evaluation program auto-generation part 31 inputs a test program 30u including a sequence of test data and expected values, compares execution results of the I/O simulator engine 30a of the newest prototype program based on the test data with the expected values of the test program 30u, and evaluates the I/O simulator engine 30a of the newest prototype program based on a comparison result (step S305).

When the execution results are identical to the expected values, an evaluation result includes normal end information indicating that a test conducted by the test program 30u normally ends. On the other hand, when the execution results are not identical to the expected values, the evaluation result includes abnormal end information indicating that the test conducted by the test program 30u does not normally end and feedback is necessary to the LSI hardware developer 2. The abnormal end information may include test items in which the execution results are not identical to the expected values, the execution results themselves, and the expected values themselves.

The evaluation program auto-generation part 31 outputs the evaluation result obtained in the step S305 to a new evaluation result file with a file name including a current date and time (step S306). The new valuation result file is accumulated in the storage area.

Figure 8B:
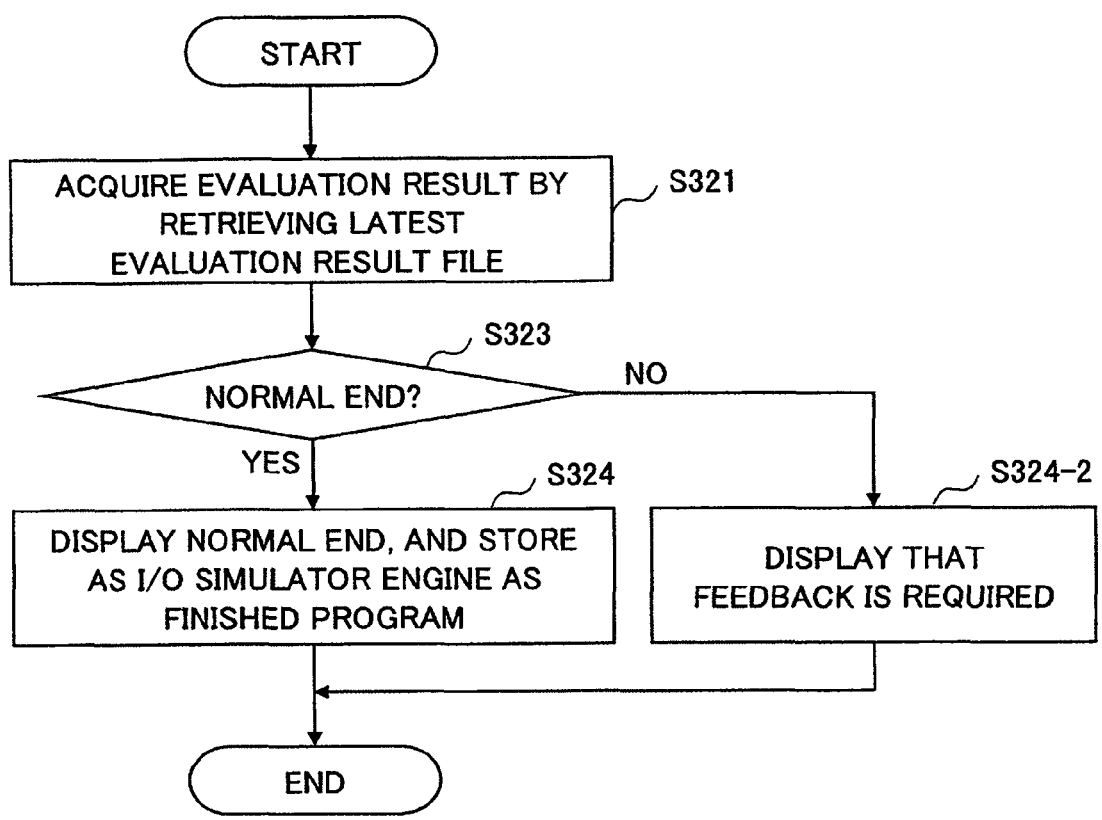
FIG. 8B is a flowchart for explaining a process conducted by a determination process part.

The determination process part 32 conducts a process shown in FIG. 8B in response to a process end of the evaluation program auto-generation part 31. FIG. 8B is a flowchart for explaining the process conducted by the determination process part. In FIG. 8B, the determination process part 32 acquires the evaluation result by searching for the latest evaluation result file (step S321), and determines whether or not the evaluation result acquired in the step S321 indicates a normal end (step S323).

When the evaluation result indicates the normal end, the determination process part 32 informs the software developer 3 by displaying that the evaluation normally ends, at the display unit 13, and stores the I/O simulator engine 30a as the I/O simulator engine 30b of the finished program which can be provided to the user 4 (step S324). Then, the determination process part 32 terminates the process.

On the other hand, when the evaluation result indicates the abnormal end, the determination process part 32 informs the software developer 3 by displaying that the feedback is necessary to the LSI hardware developer 2 (step S324-2), and terminates the process.

Screens displayed by the simulator development system 100 will be described with reference to FIG. 9A and FIG. 9B. FIG. 9A is a diagram showing an example of an edit menu screen for the LSI hardware developer. In FIG. 9A, an edit menu screen 71 is a menu screen for the LSI hardware developer 2 to edit data maintained by the data file management part 10.

The edit menu screen 71 includes a button 71a for editing the latest macro list file 11a from the type-macro combination table 10a, a button 71b for editing the latest parameter list file 11b from the I/O related data 10b, and a button 71c for editing the latest state transition model file 11c of the type(x) from the I/O behavior diagram data 10c.

When the LSI hardware developer 2 selects the button 71a, the data file management part 10 selects the latest macro list file 11a from the type-macro combination table 10a, and displays contents of the latest macro list file 11a in a macro list screen 81a which allows the LSI hardware developer 2 to edit the contents. The latest macro list file 11a edited by the LSI hardware developer 2 is stored as a new macro list file 11a and accumulates in the type-macro combination table 10a.

When the LSI hardware developer 2 selects the button 71b, the data file management part 10 selects the latest parameter list file 11b from the I/O related data 10b, and displays contents of the latest parameter list file 11b in a parameter list screen 81b which allows the LSI hardware developer 2 to edit the contents. The latest parameter list file 11b edited by the LSI hardware developer 2 is stored as a new parameter list file 11b and accumulated in the I/O related data 10b.

When the LSI hardware developer 2 selects the button 71c, the data file management part 10 urges the LSI hardware developer 2 to input a desired type (x). Based on the type name of the desired type (x) input in a predetermined input area, the data file management part 10 selects the latest state transition model file 11c of the type (x) from the I/O behavior diagram data 10c, and displays contents of the latest state transition model file 11c in a state transition screen 81c which allows the LSI hardware developer 2 to edit the contents. The latest state transition model file 11c of the type(x) edited by the LSI hardware developer 2 is stored as a new state transition model file 11c of the type (x) and is accumulated in the I/O behavior diagram data 10c.

FIG. 9B is a diagram showing an example of a simulator auto-development screen for the software tool developer. In FIG. 9B, a simulator auto-developer screen 72 is a screen to acquire a type name of the desired type(x) from the software tool developer 3 by the program auto-generation part 21.

The simulator auto-development screen 72 includes a selection area 72a for selecting a type name of a simulator which is to be created, an execution button 72b for generating the simulator with the selected type name, a display area 72c showing a generation state of the simulator, and a display area 72d showing the evaluation result of the generated simulator.

The edit menu screen 71 shown in FIG. 9A and the simulator auto-development screen 72 shown in FIG. 9B may be formed together in one screen.

As described above, the LSI hardware developer 2 simply creates the type-macro combination table 10a, the I/O related data 10b, and the I/O behavior diagram data 10c. The I/O simulator engine 30a can be automatically generated and evaluated in response to the type of the LSI 2b which is provided to the user 4. Moreover, the type(x)-LSI specification 20a, which corresponds to the type of the LSI 2b to be provided to the user 4, can be automatically generated.

Accordingly, since the I/O simulator engine 30a is automatically generated and evaluated at the approximately same time of automatically generating the type(x)-LSI specification 20a, a development until a completion of evaluating the I/O simulator engine 30a can be conducted in a shorter time.

Moreover, since it is automatically determined whether or not the feedback to the LSI hardware developer 2 is required based on the evaluation result, it is possible to reduce a workload of the evaluation conducted by the software tool developer 3. In addition, since the feedback of the evaluation result can be immediately forwarded to the LSI hardware developer 2, it is possible to promptly correcting missing descriptions and typographical errors in the type(x)-LSI specification 20a. By forwarding the feedback to the LSI hardware developer 2, the I/O simulator engine 30a can be generated faster at a higher evaluation level.

Furthermore, instead of creating a document, the LSI hardware developer 2 simply input data, so that the type (x)-I/O specification 20a can be easily created for each specified type within a shorter time. The LSI hardware developer 2 is not required to make a document for each of various types of the LSI 2b. In addition, since it can be easily conducted to maintain additions or like of types of the LSI 2b, it is possible for the LSI hardware developer 2 to dedicate hardware developments of various types of the LSI 2b.

Moreover, even in a case of divert existing internal macros, it is simply required to change the I/O related data 10b alone. The latest state transition model file 11c being accumulated in the I/O behavior diagram data 10c can be automatically selected.

Furthermore, the date and time are additionally included in the file names of the macro list files 11a, the parameter list files 11b, and the state transition model files 11c which are respectively accumulated in the type-macro combination table 10a, the I/O related data 10b, and the I/O behavior diagram data 10c. Therefore, it is possible to easily search for a latest file and maintain existing files being accumulated in a time sequence. Also, it is not required to install a special tool for a version management.

The present invention is not limited to the specifically disclosed embodiments, and variations and modifications may be made without departing from the scope of the invention.

What is claimed is:

1. A simulator engine development system for developing a simulator engine of an integrated circuit, comprising at least one processor configured to perform a process including:
    creating a data file storing data concerning an operation of the integrated circuit for each of a plurality of types of the integrated circuit for each update of the data, each type combining macros defining behaviors of input and output parts of the integrated circuit;
    managing the data file with a file name including an updated date and time in a storage unit;
    displaying a screen at a display unit for a user to select one of the plurality of types of the integrated circuit by a type name;
    specifying a latest data file from a plurality of data files retrieved based on the type name by referring to the date and time included in the file name in response to a selection of the type name of the integrated circuit by the user, and generating a program source of the simulator engine to simulate the operation corresponding to the type of the integrated circuit, which type is specified by the type name;
    generating an execution program by compiling the program source and evaluating the execution program by using a test program; and
    determining whether or not an evaluation result by the generating the execution program indicates a state in which feedback is required to the latest data file, and displaying contents concerning the feedback based on a determination result at the display unit,
    wherein the creating the data file includes:
        creating a new first file every time a first file is updated, the first file indicating macro names to specify the macros corresponding to the type name for each type of the integrated circuit, and storing the new first file with a first file name including a first updated date and time in the storage unit;
        creating a new second file every time a second file including a list of initial values for each of the macros is updated, and storing the new second file with a second file name including a second updated date and time in the storage unit; and
        creating a new third file every time a third file storing a state transition diagram indicating a behavior of each macro is updated, and storing the new third file with a third file name including a third updated date and time in the storage unit.

2. The simulator engine development system as claimed in claim 1, wherein the determining stores the execution program as a finished product when the determination result indicates that the execution program is to be provided to a user as the finished product.

3. The simulator engine development system as claimed in claim 1, wherein the creating the data file includes a first date and time in the first file name and stores the new first file with the first file name when the first file is newly created, includes a second date and time in the second file name and stores the new second file with the second file name when the second file is newly created, and includes a third date and time in the third file name and stores the new third file with the third file name when the third file is newly created.

4. The simulator engine development system as claimed in claim 1, wherein the specifying the latest file includes:

specifying the first file having the first file name which includes a latest first updated date and time, from a plurality of the first files being stored in the storage unit, and to acquire the macro names from a combination of the macros by using the selected type name;

specifying the second file having the second file name which includes a latest second updated date and time, from a plurality of the second files being stored in the storage unit, and to acquire the list of the initial values for each macro in the combination of the macros by using the macro name acquired by the specifying the first file name; and selecting the third file having the third file name which includes a latest third updated date and time, from a plurality of the third files storing the state transition diagram of the macro specified by the macro name acquired by the specifying the first file, and to convert the state transition diagram of the selected third file into the program source.

5. The simulator engine development system as claimed in claim 4, wherein the selecting the third file creates a specification of the type of the integrated circuit which type is specified by the type name by writing the state transition diagram stored in the selected third file having the third file name including the latest third date and time, into a document file.

6. A simulator engine development method for a computer to develop a simulator engine of an integrated circuit, comprising the steps of:

creating, by using the computer, a data file storing data concerning an operation of the integrated circuit for each of a plurality of types of the integrated circuit for each update of the data, each type combining macros defining a behavior of an input and output part of the integrated circuit;

managing, by using the computer, the data file with a file name including an updated date and time in a storage unit;

displaying, by the computer, a screen at a display unit for a user to select one of the plurality of types of the integrated circuit by a type name;

specifying, by using the computer, a latest data file from a plurality of data files retrieved based on the type name by referring to the date and time included in the file name in response to a selection of the type name of the integrated circuit by the user;

generating, by using the computer, a program source of the simulator engine to simulate the operation corresponding to the type of the integrated circuit, which type is specified by the type name;

generating, by using the computer, an execution program by compiling the program source;

determining, by using the computer, whether or not an evaluation result from evaluating the execution program by using a test program indicates a state in which feedback is required to the latest data file managed in the storage unit; and displaying, by using the computer, contents concerning the feedback based on a determination result at the display unit, wherein the creating the data file includes:

creating, by using the computer, a new first file every time a first file is updated, the first file indicating macro names to specify the macros corresponding to the type name for each type of the integrated circuit, and storing the new first file with a first file name including a first updated date and time in the storage unit;

creating, by using the computer, a new second file every time a second file including a list of initial values for each of the macros is updated, and storing the new second file with a second file name including a second updated date and time in the storage unit; and creating, by using the computer, a new third file every time a third file storing a state transition diagram indicating a behavior of each macro is updated, and storing the new third file with a third file name including a third updated date and time in the storage unit.

7. A non-transitory computer-readable recording medium recorded with a computer program for causing a computer to perform as a simulator engine development system to develop a simulator engine of an integrated circuit, said computer program comprising codes to perform a process comprising:

creating a data file storing data concerning an operation of the integrated circuit for each of a plurality of types of the integrated circuit for each update of the data, each type combining macros defining a behavior of an input and output part of the integrated circuit;

managing the data file with a file name including an updated date and time in a storage unit;

displaying a screen at a display unit for a user to select one of the plurality of types of the integrated circuit by a type name;

specifying a latest data file from a plurality of data files retrieved based on the type name by referring to the date and time included in the file name in response to a selection of the type name of the integrated circuit by the user;

generating a program source of the simulator engine to simulate the operation corresponding to the type of the integrated circuit, which type is specified by the type name;

generating an execution program by compiling the program source;

determining whether or not an evaluation result from evaluating the execution program by using a test program indicates a state in which feedback is required to the latest data file managed in the storage unit; and displaying contents concerning the feedback based on a determination result at the display unit, wherein the creating the data file includes:

creating a new first file every time a first file is updated, the first file indicating macro names to specify the macros corresponding to the type name for each type of the integrated circuit, and storing the new first file with a first file name including a first updated date and time in the storage unit;

creating a new second file every time a second file including a list of initial values for each of the macros is updated, and storing the new second file with a second file name including a second updated date and time in the storage unit; and creating a new third file every time a third file storing a state transition diagram indicating a behavior of each macro is updated, and storing the new third file with a third file name including a third updated date and time in the storage unit.

* * * * *